US012090500B2

(12) United States Patent
Nolte et al.

(10) Patent No.: US 12,090,500 B2
(45) Date of Patent: Sep. 17, 2024

(54) COATING THICKNESS OPTIMIZATION AND PROGRAMMING METHOD FOR A COATING SYSTEM AND CORRESPONDING COATING SYSTEM

(71) Applicant: Dürr Systems AG, Bietigheim-Bissingen (DE)

(72) Inventors: Hans-Jürgen Nolte, Besigheim (DE); Frank Herre, Oberriexingen (DE); Christoph Heckeler, Renningen (DE)

(73) Assignee: Dürr Systems AG, Bietigheim-Bissingen (DE)

( * ) Notice: Subject to any disclaimer, the term of this patent is extended or adjusted under 35 U.S.C. 154(b) by 0 days.

(21) Appl. No.: 18/466,953

(22) Filed: Sep. 14, 2023

(65) Prior Publication Data

US 2023/0415186 A1 Dec. 28, 2023

Related U.S. Application Data

(63) Continuation of application No. 17/609,431, filed as application No. PCT/EP2020/062874 on May 8, 2020, now Pat. No. 11,819,862.

(30) Foreign Application Priority Data

May 20, 2019 (DE) ..................... 10 2019 113 341.6

(51) Int. Cl.
*B05B 12/08* (2006.01)
*B05B 13/04* (2006.01)
(Continued)

(52) U.S. Cl.
CPC ........ *B05B 12/084* (2013.01); *B05B 13/0431* (2013.01); *B25J 9/1664* (2013.01); *G06F 30/20* (2020.01)

(58) Field of Classification Search
CPC ... B05B 12/084; B05B 13/0431; B25J 9/1664
See application file for complete search history.

(56) References Cited

U.S. PATENT DOCUMENTS

| 5,521,477 A | 5/1996 | Sasaki |
| 6,064,919 A | 5/2000 | Slusarczyk |
| 2018/0149634 A1 | 5/2018 | Dattilo et al. |

FOREIGN PATENT DOCUMENTS

| DE | 10150826 A1 | 4/2003 |
| DE | 10225276 A1 | 12/2003 |

(Continued)

OTHER PUBLICATIONS

Arikan et al., "Modeling of paint flow rate flux for elliptical paint sprays by using experimental paint thickness distributions" (2006) (Year: 2006).*

(Continued)

*Primary Examiner* — Nathan T Leong
(74) *Attorney, Agent, or Firm* — Bejin Bieneman PLC

(57) ABSTRACT

The disclosure relates to a program-controlled coating robot for coating components. A robot path is preset and application parameters observed by the applicator are also preset based on real coating operation during movement along the robot path. There is a virtual determination of a coating result for the predetermined robot path and the predetermined application parameters. The disclosure provides steps for virtual determination of the coating result including generating real spray pattern data and/or reading out real spray pattern data from a database as a function of the predetermined robot path and/or the predetermined application parameters, the read-out real spray pattern data reproducing a spray pattern which the applicator generates during a real coating operation with the predetermined application parameters and/or on the predetermined robot path, and (Continued)

determining the coating result taking into account the real spray pattern data read out from the database or the generated spray pattern data.

14 Claims, 5 Drawing Sheets

(51) Int. Cl.
*B25J 9/16* (2006.01)
*G06F 30/20* (2020.01)

(56) References Cited

FOREIGN PATENT DOCUMENTS

| EP | 0867233 A1 | 9/1998 |
|---|---|---|
| JP | 2007508937 A | 4/2007 |
| JP | 2018502702 A | 2/2018 |

OTHER PUBLICATIONS

Notification of Reasons for Rejection from the Japan Patent Office mailed Jan. 29, 2024 for Application No. JP2021-569303 (8 pages; with English machine translation).
International Search Report and Written Opinion for PCT/EP2020/062874 mailed Jul. 24, 2020 (12 pages; with English translation).
Arikan S. Balkan T. "Modeling of paint flow rate flux for elliptical paints sprays by using experimental paint thickness distributions" Industrial Robot, vol. 33, No. 1, 2006, XP002799327.
Shengrui, Y., Ligang, C.: "Modeling and Prediction of Paint Film Deposition Rate for Robotic Spray Painting", Proceedings of the 2011 IEEE International Conference on Mechatronics and Automation 2011.
German Office Action mailed Feb. 5, 2020 for Application No. DE 10 2019 113 341.6 (7 pages; with English translation).
Liu Tie, Yang Jing, Cao Xianbin; Secondary Mathematical Modeling Methods, p. 165, Southwest Jiaotong University Press, Jun. 2018 (with English translation; 12 pages).
Office Action from Chinese Patent Office for related application No. 202080037392.2 mailed Apr. 29, 2023 (with English machine translation; 18 pages).

* cited by examiner

COATING THICKNESS OPTIMIZATION AND PROGRAMMING METHOD FOR A COATING SYSTEM AND CORRESPONDING COATING SYSTEM

CROSS-REFERENCE TO RELATED APPLICATIONS

This application is a continuation of, and claims priority to, U.S. patent application Ser. No. 17/609,431, filed Nov. 8, 2021, which is a national stage of, and claims priority to, Patent Cooperation Treaty Application No. PCT/EP2020/062874, filed on May 8, 2020, which application claims priority to German Application No. 10 2019 113 341.6, filed on May 20, 2019, which applications are hereby incorporated herein by reference in their entireties.

FIELD

The disclosure relates to a method for parameterizing and programming a program-controlled coating robot for coating components, in particular for a painting robot for painting motor vehicle body components. Furthermore, the disclosure relates to a correspondingly operating coating system.

BACKGROUND

In modern painting systems for painting motor vehicle body components, rotary atomizers are usually used as applicators, which are guided by a multi-axis painting robot with serial robot kinematics along predetermined robot paths over the surfaces of the motor vehicle body components to be painted. The rotary atomizer is operated with specific application parameters (e.g. paint quantity, rotational speed, shaping air, high voltage of the electrostatic coating agent charge, etc.).

The challenge here is to program the application parameters and robot paths for a specific automotive body with a given shape.

A conventional approach to programming the application parameters and the robot paths is the so-called "teaching". The programmer defines the robot path along the component surface by programming specific points of the robot path, which are then automatically traversed during painting. In addition, the programmer determines the application parameters according to his experience, which are observed by the rotary atomizer when following the specified robot path. In a test mode, painting is then carried out with the specified robot path and the specified application parameters in order to then check the coating result. Depending on the quality of the coating result achieved, the robot path and the application parameters can then be adjusted to improve the coating result accordingly. In this way, an acceptable coating result can be achieved in just a few iteration steps.

The disadvantage of this known approach to programming the robot paths and the application parameters is first of all the fact that the experience of the programmer is important for achieving a good coating result. In addition, this usually requires several iteration steps (optimization loops), each with a corresponding material consumption.

Another approach to programming the robot paths and the application parameters consists in a complete simulation of the coating result in a corresponding computer model.

The disadvantage of this approach to programming the robot paths and the application parameters is first of all the fact that enormous computing power is required in order to achieve meaningful results with regard to the coating result. In addition, the physical modeling of the complete painting process is extremely difficult, so that the reliability of such a model-based determination of the coating result is not yet fully satisfactory.

For the technical background of the disclosure, reference should also be made to the following publications:
Arikan S., Balkan T.: "Modeling of paint flow rate flux for elliptical paints sprays by using experimental paint thickness distributions", Industrial Robot, Vol. 33, 2006 No. 1, ISSN 0143-991X,
U.S. Pat. No. 5,521,477 A,
DE 101 50 826 A1,
Shengrui, Y., Ligang, C.: "Modeling and Prediction of Paint Film Deposition Rate for Robotic Spray Painting", Proceedings of the 2011 IEEE International Conference on Mechatronics and Automation 2011.

DETAILED DESCRIPTION

Figure 1:
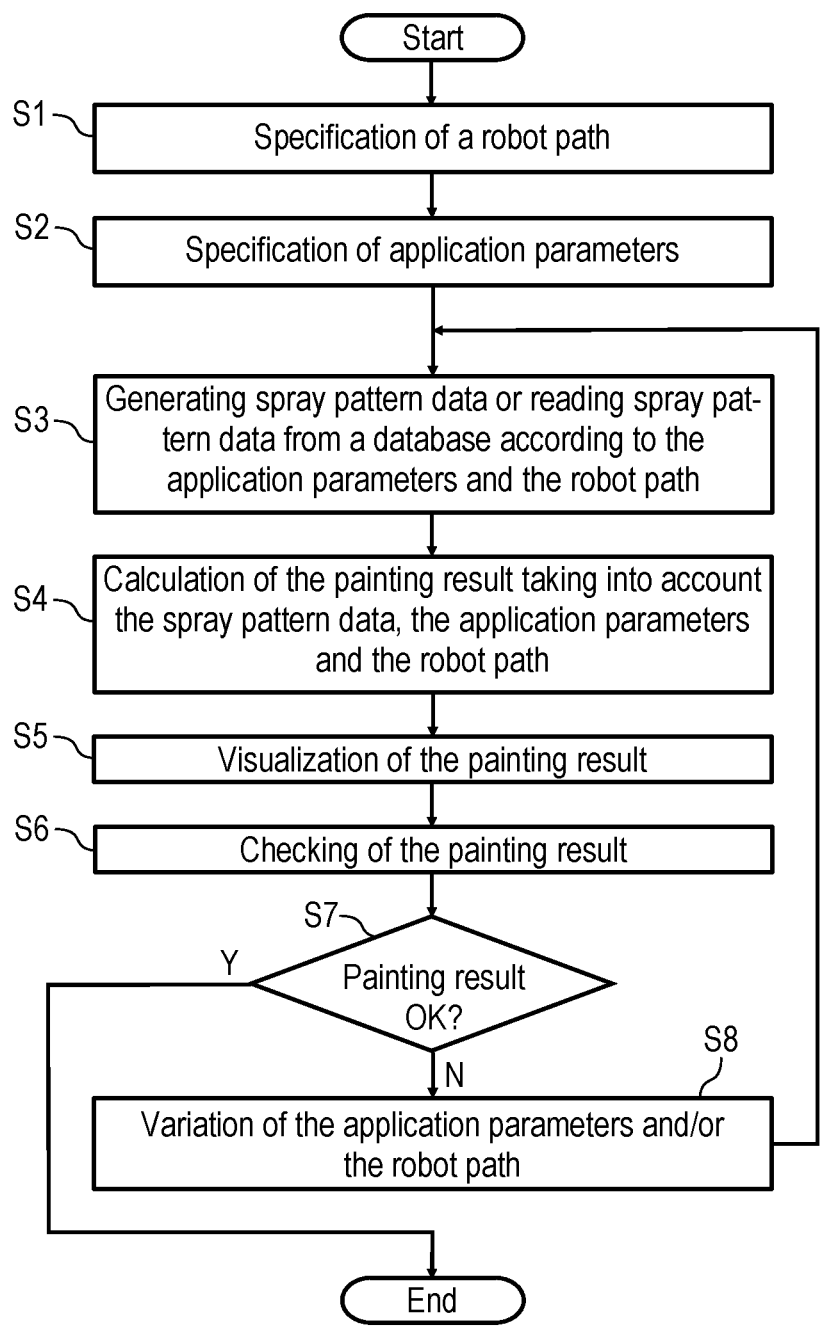
FIG. 1 a flow chart illustrating the programming method according to the disclosure.

The method according to the disclosure firstly provides that a robot path is specified, as is known in principle from the prior art. For example, the robot path can be defined by a plurality of path points, which are then successively traversed by the paint application point of the applicator (e.g. rotary atomizer). The robot path can reflect not only the position of the individual path points in Cartesian spatial coordinates, but also the desired spatial orientation of the spray axis of the applicator used (e.g. rotary atomizer).

In addition, the method according to the disclosure provides that application parameters are specified which are to be maintained by the applicator and the coating robot in real coating operation during movement along the robot path. The term "application parameter" used in the context of the disclosure preferably includes the operating variables of the applicator used, such as atomizer rotational speed, shaping air flow/shaping air pressure, high voltage of an electrostatic coating agent charge and/or paint volume flow. However, the term "application parameters" as used within the scope of the disclosure is not limited to the foregoing examples of applicator operating variables. In addition, the term "application parameters" used in the context of the disclosure preferably also includes operating variables of the coating robot, such as, for example, the painting speed at which the coating robot moves the applicator over the component surface.

As part of the programming method according to the disclosure, the coating result is then determined virtually, which is achieved when painting along the specified robot path with the specified application parameters. However, in the context of the disclosure, this virtual determination of the coating result is not exclusively model-based, but takes into account real spray pattern data.

Spray tests with the applicator can be carried out in advance, with the coating result being measured in real terms for specific application parameters and specific robot paths. For example, test sheets can be coated, and the coating thickness profile on the test sheet is then measured. The spray pattern data determined in this way can then be stored in a database in an assignment to the respective application parameters and the respective robot path.

In the programming method according to the disclosure, the spray pattern data associated with the specified application parameters and the specified robot path are determined. The virtual determination of the coating result is then carried out as a function of these spray pattern data, which were previously measured in real terms. This involves extrapolation, for example from the coating thickness profile on a flat test sheet to the corresponding coating thickness profile on a curved component surface. The programming method according to the disclosure thus determines the coating result in a quasi hybrid form, in that both real spray pattern data are taken into account and an extrapolation model is used to convert the real spray pattern data to the real motor vehicle body.

The robot path and the application parameters can then be optimized as part of the programming method according to the disclosure, which can be done in several iteration loops. If the virtually determined coating result is not satisfactory, the application parameters and the robot path can be adapted in order to then determine the coating result virtually for the adapted application parameters and/or the adapted robot path. In this way, an acceptable coating result can be achieved in just a few iteration loops, with the associated application parameters and the associated robot path then being adopted for subsequent painting operation. The advantage of these programming methods according to the disclosure is the fact that the iteration loops for determining the acceptable application parameters and the acceptable robot path do not lead to a corresponding material consumption, since the coating result is determined virtually in each case.

The variation of the application parameters or the path trajectories (robot path) within given limits for optimizing the coating thickness uniformity is primarily performed automatically based on a computer algorithm. This is preferably the task of an optimization unit which automatically compares the coating thickness uniformity achieved in the virtual determination of the coating result with a permissible coating thickness variation and, if necessary, initiates iteration loops with modified application parameters and/or path sequences (robot paths). The given limits result from the process windows of the application parameters or proven concepts of the robot paths which are favorable for the industrial application according to experience. In addition, or as an alternative to this automatic optimization process, the assessment of the coating thickness uniformity and the variation of the application parameters or path sequences can also be carried out "manually" by the user.

It has already been briefly mentioned above that the spray pattern data can be determined, for example, by experiments in which test sheets are coated with different sets of application parameters. The programming method according to the disclosure therefore preferably also includes the performance of real application trials with different application parameters and/or different robot paths, in particular by coating test sheets with the different application parameters. The spray pattern is then measured during the real application tests and corresponding spray pattern data is determined. The spray pattern data determined in this way is then stored in the database for the various application parameters and robot paths. It is important that the spray pattern data is stored in the database in a fixed assignment to the underlying application parameters and robot paths, so that the associated spray pattern data can be read out from the database later as a function of the application parameters and the robot path.

In practice, it is difficult for spray pattern data to be actually measured and stored for all combinations of application parameters and robot paths. It is therefore also possible for the database to contain a map in which the actual measured spray pattern data only form individual interpolation points. The remaining map points can then be interpolated from these grid points, for example.

Furthermore, it should be mentioned that the painting of a motor vehicle body is usually carried out with different so-called brushes. The term "brush" used in the disclosure preferably defines the complete set of application parameters and the robot path. For example, large-area painting is usually carried out with a so-called surface brush, which is characterized by a wide shape or a wide coating thickness profile. The painting of edges or details, on the other hand, is usually carried out with a so-called edge brush, which is characterized by a narrow shape or a narrow film thickness profile. The database with the spray pattern data should therefore preferably contain spray pattern data for both the surface brush and the edge brush. As part of the programming method according to the disclosure, the surface brush is then preferably optimized in the manner generally described above. Subsequently, the separate optimization of the edge brush is carried out in essentially the same way.

It should also be mentioned that the edge brush can be used, for example, for painting fenders, A-pillars, B-pillars, C-pillars, tornado lines or sill areas, to name just a few examples.

The optimized surface and edge brushes can lead to unsatisfactory coating results (hot spots), e.g. at module joints (transition areas between individual painting modules, e.g. between the fender and hood). Within the scope of the disclosure, it is therefore also possible to optimize the coating thickness uniformity at hot spots by locally varying the robot paths and the affected brushes, if necessary by adjusting the switch-on/switch-off points of the paint flow.

Furthermore, it should be mentioned that within the scope of the disclosure, preferably not only the operating parameters of the applicator (e.g. rotary atomizer) are optimized, but preferably also the robot path itself.

With regard to the spray pattern data, various possibilities exist within the scope of the disclosure. For example, the spray pattern data for the individual spray patterns can each comprise at least one spray pattern characteristic value which characterizes the spray pattern. For example, this can be the SB[50] value, which is known per se. The SB[50] value is the width of the coating thickness profile within which the coating thickness on the component surface is at least 50% of the maximum coating thickness SDmax. However, it is also possible, alternatively or additionally, that at least one of the spray pattern characteristic values is an SDmax value which reflects the maximum coating thickness.

Furthermore, it should be mentioned that the real coating thickness profile can be reproduced by mathematical curves (e.g. Gaussian curves).

In addition, it is possible within the scope of the disclosure for the coating result to be represented graphically, for example with the resulting coating thickness profile. The programmer can then directly assess the virtually determined coating result on the basis of the display and decide whether the coating result is acceptable.

In addition to the programming method according to the disclosure described above, the disclosure also comprises a corresponding coating system which is suitable for carrying out the programming method according to the disclosure.

Thus, the coating system according to the disclosure also comprises a coating robot and an applicator (e.g. rotary atomizer), which is guided by the coating robot and applies the coating agent to the component (e.g. motor vehicle body) during operation.

The coating system according to the disclosure is characterized by a database containing spray pattern data for different application parameters and different robot paths, which reproduce a real spray pattern generated by the applicator during real coating operation with the application parameters and/or on the robot path. It should be mentioned here that the database is usually not completely filled with the required spray pattern data at the beginning. The spray pattern data can then be determined subsequently during operation and fed into the database.

In addition, the coating system according to the disclosure comprises a computing unit which virtually calculates the coating result from predetermined application parameters and predetermined robot paths, taking into account the stored spray pattern data.

Furthermore, the coating system according to the disclosure preferably comprises an optimization unit which optimizes the application parameters and/or the robot path, which can be done, for example, in several iteration loops. The optimization unit specifies certain application parameters and/or a certain robot path and then evaluates the virtually determined coating result. If the virtually determined coating result is acceptable, the application parameters and the robot path can be adopted for the subsequent real coating operation. Otherwise, the optimization unit varies the application parameters and the robot path until the virtually determined coating result is acceptable.

Preferably, the coating system according to the disclosure also has a display unit (e.g., screen) for graphically displaying the coating result.

In the following, the flow chart according to FIG. 1 is described, which illustrates the programming method according to the disclosure in schematic form.

In a first step S1, a robot path is first specified. For this purpose, path points can be defined which are to be successively traversed from by the paint impact point of the applicator used (e.g. rotary atomizer). The individual path points can be defined, for example, by Cartesian spatial coordinates (X, Y, Z). In addition, the desired orientation of the spray axis of the applicator used is preferably also specified in the individual path points, for which purpose, for example, a vector with three components (XR, YR, ZR) can be defined.

In a further step S2, the complete set of application parameters is then defined with which the applicator is to work in the actual painting operation. These include, for example, the atomizer rotational speed, the shaping air flow, the paint flow, the high voltage of the electrostatic coating agent charge and the painting speed at which the painting robot moves the applicator over the component surface.

In a step S3, spray pattern data is then read from a database that matches the specified robot path and application parameters and has been previously determined. Alternatively, the spray pattern data can also be generated first, provided it has not yet been stored.

In step S4, a virtual calculation of the coating result for the specified robot path and the specified application parameters is then performed, taking into account the spray pattern data read from the database. For example, the spray pattern data previously measured on a flat test sheet is converted or extrapolated to the real coating result on a curved component surface.

In step S5, the coating result can then be visualized.

In a step S6, it is then checked whether the coating result is acceptable. One possibility for this is that the programmer himself checks whether the coating result is acceptable on the basis of the visualization in step S5. However, a preferred other possibility is that a computer algorithm is used to automatically check whether the coating result is acceptable. If this is the case, the programming procedure is completed in a step S7 and the specified robot path and the specified application parameters can be adopted for subsequent painting.

Otherwise, there is still a need for optimization, so that the application parameters and/or the robot path are then modified in a step S8, with steps S3-S7 then being repeated in an iteration loop until an acceptable coating result is obtained. This repetition in an iteration loop can be automatic or user-controlled.

Figure 2:
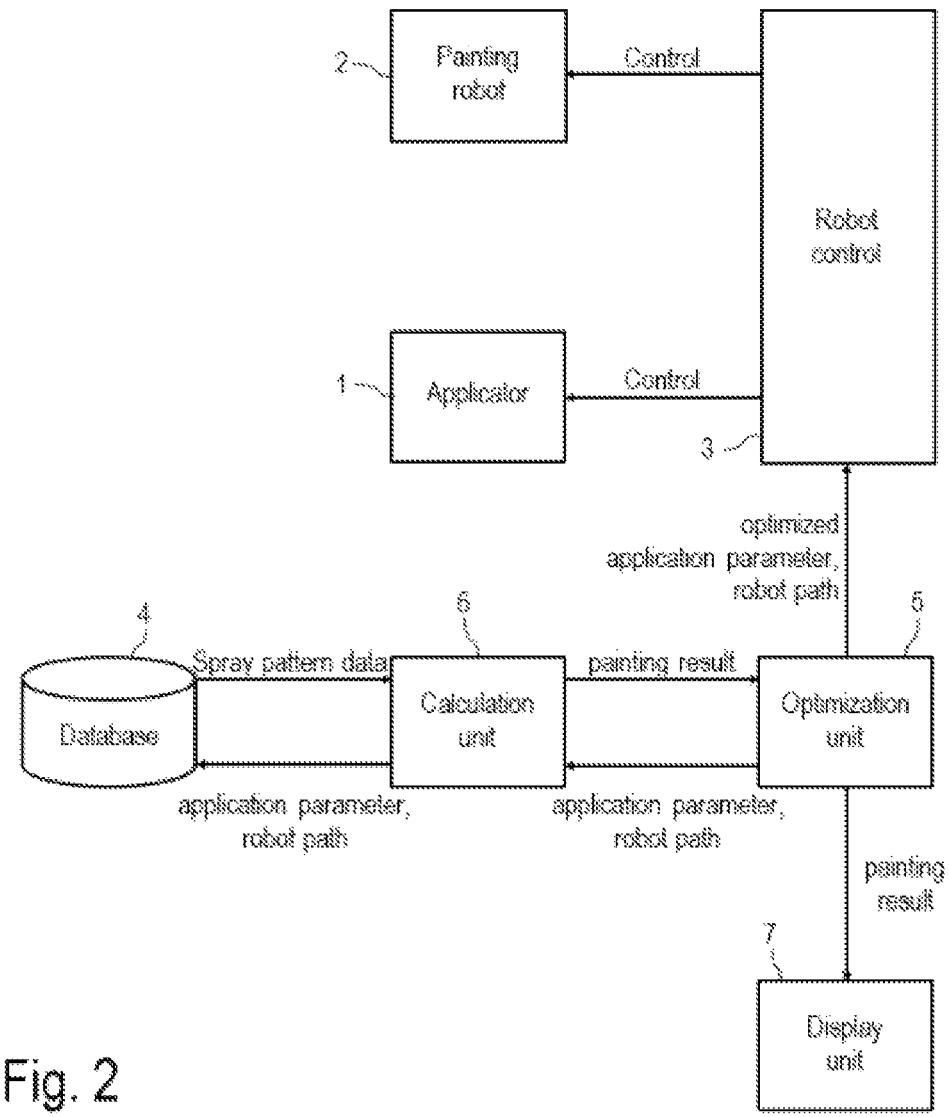
FIG. 2 is a schematic representation of a coating system according to the disclosure,
FIG. 3 a coating thickness profile, which was measured in real,
FIG. 4 a coating thickness curve, which was measured in real with a mathematical approximation,
FIG. 5 an example of a map with stored spray pattern data, and
FIG. 6 a flow chart illustrating a further development of the programming method according to the disclosure.

FIG. 2 shows a schematic, simplified representation of a painting system according to the disclosure for painting motor vehicle body components. The painting system initially has an applicator 1, which may be a rotary atomizer, for example.

In operation, the applicator 1 is moved over the component surface by a multi-axis painting robot 2 with serial robot kinematics.

The applicator 1 and the painting robot 2 are controlled by a robot controller 3, whereby the robot controller 3 controls the painting robot 2 in such a way that the applicator 1 moves along a predefined robot path with its paint impact point. The robot controller 3 controls the applicator 1 with certain application parameters (e.g. atomizer rotational speed, paint flow, etc.).

It should be mentioned here that the robot controller 3 can be distributed over several control units.

The painting system according to the disclosure also has a database 4 in which spray pattern data for a large number of different application parameters and robot paths are stored. These spray pattern data were previously measured in spray tests, with the application parameters and robot paths being varied accordingly.

In addition, the painting system according to the disclosure has an optimization unit 5 which, as a starting point for optimization, first specifies a set of application parameters and a particular robot path and forwards these to a computing unit 6. The computing unit 6 then reads the associated spray pattern data from the database 4 as a function of the specified application parameters and the specified robot path. The computing unit 6 then calculates the coating result on the component surface from the spray pattern data and reports the coating result back to the optimization unit 5. The optimization unit 5 then displays the coating result graphically on a display unit 7. In addition, the optimization unit 5 can vary and optimize the application parameters and the robot path in an iteration loop, in each case virtually determining and evaluating the coating result. The optimization is therefore preferably performed automatically by the optimization unit 5.

Figure 3:
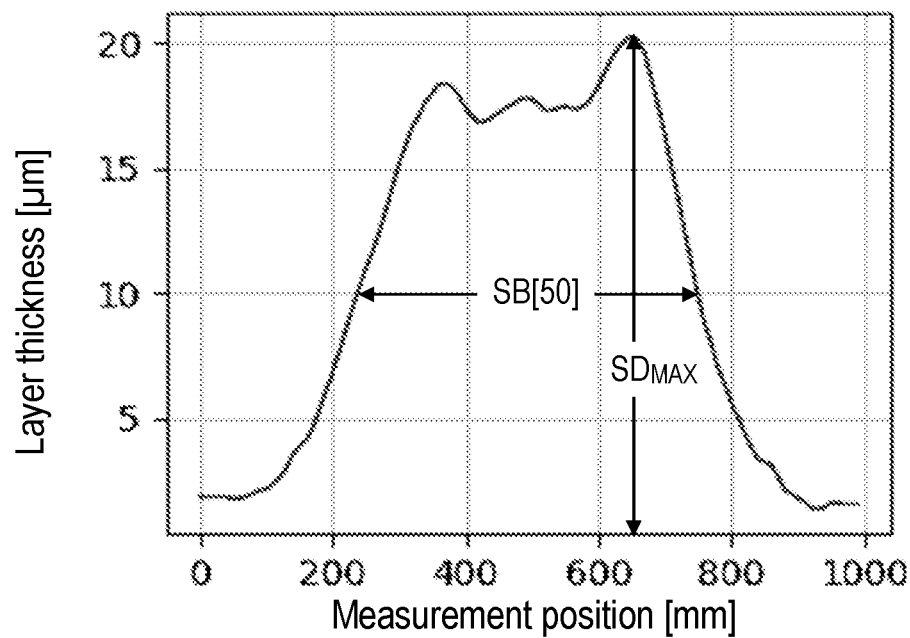

FIG. 3 shows a coating thickness profile generated by a rotary atomizer on the component surface, the coating thickness profile being based on a real measurement. In the programming method according to the disclosure, spray pattern parameters can be calculated from the real coating thickness profile, such as the SB[50] value or the maximum value SDmax. The SB[50] value indicates the width of the coating thickness profile within which the coating thickness is at least 50% of the maximum coating thickness SDmax.

Figure 4:
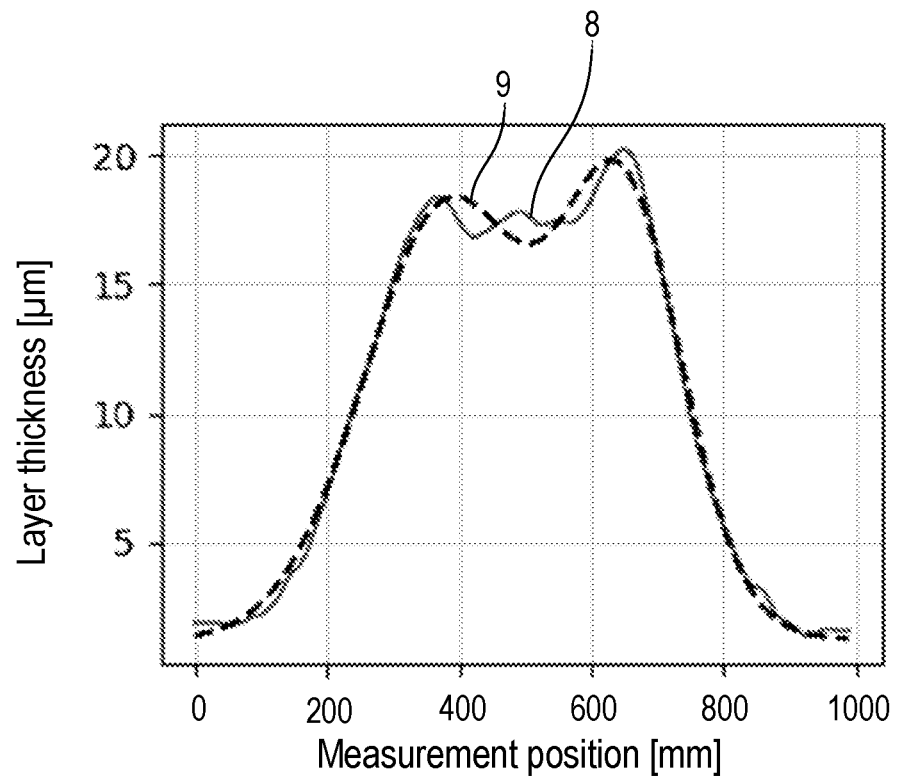

FIG. 4 shows a corresponding coating thickness profile, namely a real measured coating thickness profile 8 and a mathematically approximated coating thickness profile 9. For example, the real measured coating thickness profile 8 can be simulated by Gaussian curves.

Figure 5:
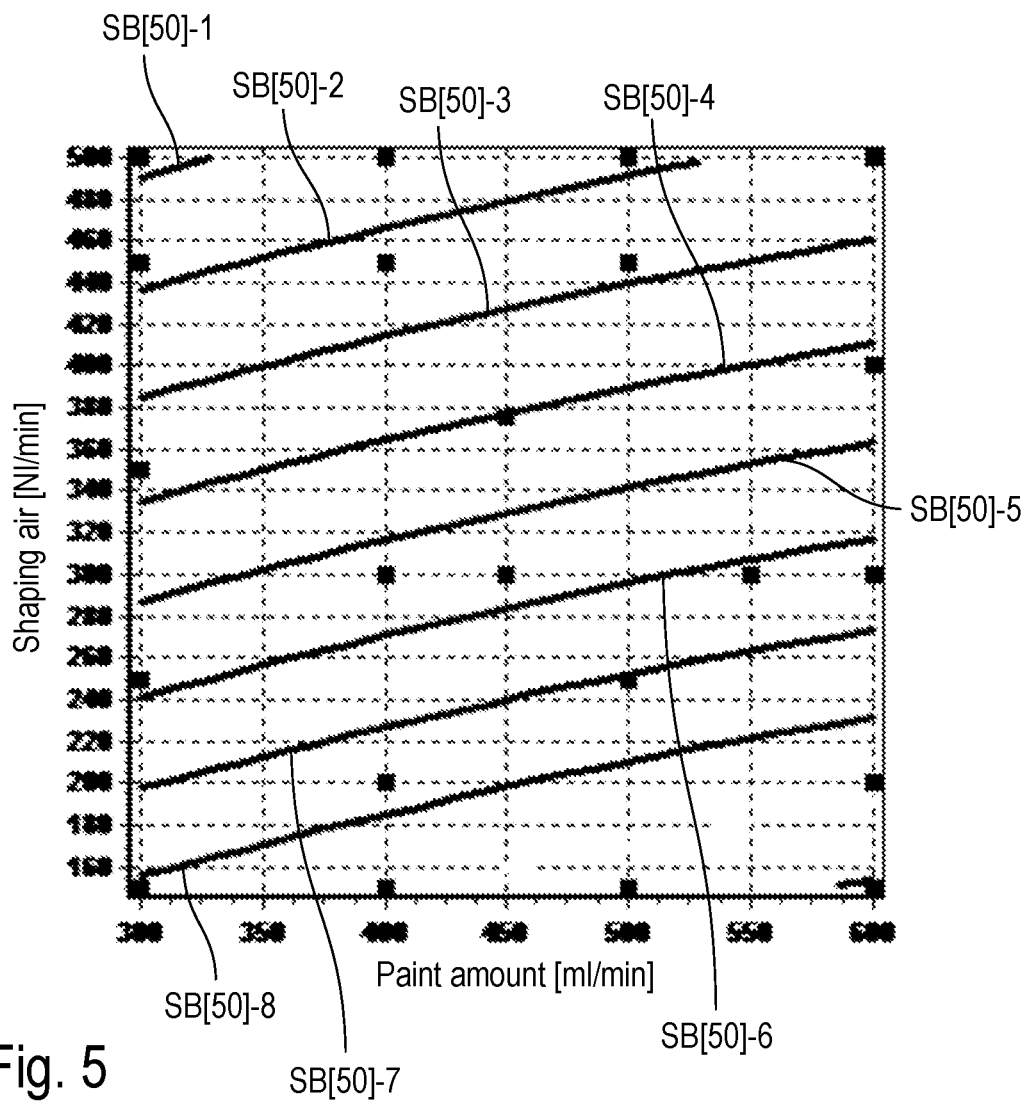

FIG. 5 shows a stored map with spray pattern data for different paint quantities and different air flows. The stored spray pattern data are different SB[50] values for the different paint quantities and the different air streams.

Figure 6:
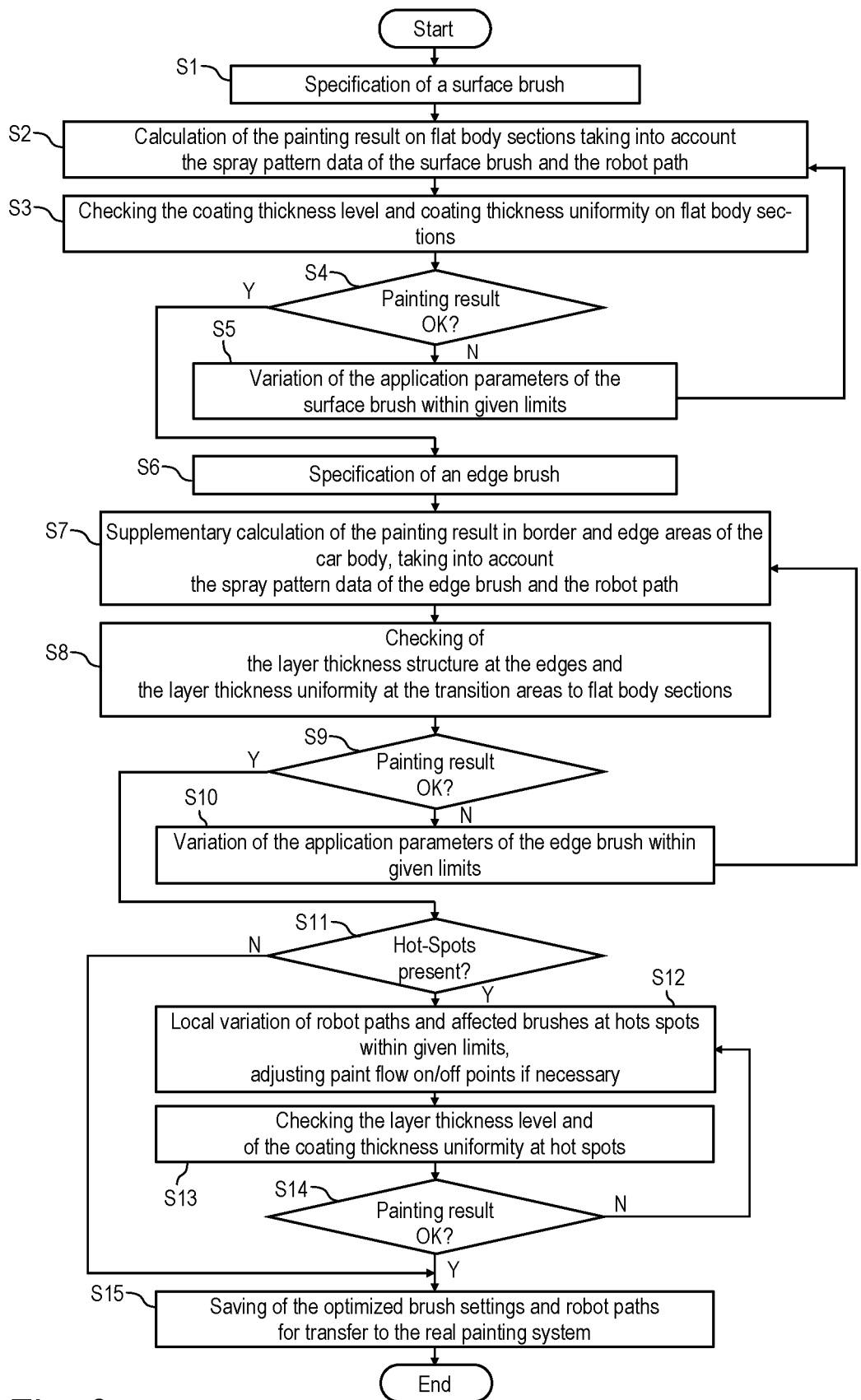

FIG. 6 shows a further development of the programming method according to the disclosure.

In a first step S1, a surface brush (main brush) is first specified. The surface brush defines all application parameters and the robot path for painting large areas of the vehicle body, for example a roof area.

In a step S2, the coating result is then determined virtually in the manner described above, taking into account the spray pattern data read out from the database.

In a step S3, it is then checked whether the coating thickness level of the coating thickness uniformity is acceptable.

In a step S4 it is then checked on this basis whether the coating result is acceptable.

If this is not the case, in a step S5 the application parameters of the surface brush are varied within given limits and the above steps S2-S4 are repeated in an iteration loop until an acceptable coating result for the surface brush is obtained.

In steps S6-S10, the same process then takes place for an edge brush, which is used for painting edges and edge areas of the body.

Finally, in steps S11-S15, the application parameters and robot paths for painting hot spots are tested and optimized. These are problematic surface areas of motor vehicle bodies that are difficult to paint.

The disclosure is not limited to the preferred embodiments described above. Rather, a large number of variants and variations are possible which also make use of the inventive concept and therefore fall within the scope of protection. In particular, the disclosure also claims protection for the subject matter and the features of the dependent claims independently of the claims referred to in each case and in particular also without the features of the main claim. The disclosure thus comprises different aspects of the disclosure which enjoy protection independently of each other.

The invention claimed is:

1. A coating installation for coating components with a coating agent, comprising:

a) a coating robot, b) an applicator which is guided by the coating robot along a predetermined robot path and applies the coating agent to the component during operation, c) a database which contains spray pattern data for various application parameters, the various application parameters including a surface brush set of parameters and an edge brush set of parameters, the surface brush set of parameters having a wider coating thickness profile than the edge brush set of parameters, and d) a computing unit which determines real spray pattern data as a function of the predetermined robot path, the surface brush set of parameters and the edge brush set of parameters, the real spray pattern data reproducing a spray pattern which the applicator generates during a real coating operation with at least one of the various application parameters and on the predetermined robot path.

2. The coating system according to claim 1, wherein the computing unit determines a coating result based on the real spray pattern data.

3. The coating system according to claim 2, further comprising an optimization unit which optimizes at least one of the various application parameters and the predetermined robot path as a function of the coating result.

4. The coating system according to claim 2, further comprising a display unit for graphical visualization of the determined coating result.

5. The coating system according to claim 1, wherein the database contains spray pattern data for different variations of the edge brush set of parameters.

6. The coating system according to claim 5 wherein the computing unit determines coating results for the different variations of the edge brush set of parameters.

7. The coating system according to claim 6, wherein the computing unit selects one variation of the different variations of the edge brush set of parameters based on the determined coating results.

8. The coating system according to claim 1, wherein the database contains spray pattern data for different variations of the surface brush set of parameters.

9. The coating system according to claim 8, wherein the computing unit determines coating results for the different variations of the surface brush set of parameters.

10. The coating system according to claim 9, wherein the computing unit selects one variation of the different variations of the surface brush set of parameters based on the determined coating results.

11. The coating system according to claim 1, wherein the computing unit determines coating results for different variations of the robot path and selects one variation of the different variations of the robot path based on the determined coating results.

12. The coating system according to claim 1, wherein the real spray pattern data determined by the computing units as a function of the predetermined robot path, the surface brush set of parameters and the edge brush set of parameters includes a coating thickness profile.

13. The coating system according to claim 12, wherein the real spray pattern data determined by the computing units as a function of the predetermined robot path, the surface brush set of parameters and the edge brush set of parameters includes an SB[50] value and an SDmax-value of the coating thickness profile.

14. The coating system according to claim 1, wherein the computing unit uses the various application parameters to determine at least one of the following operating variables of the applicator and the coating robot:

a) atomizer rotational speed of a rotary atomizer forming the applicator, b) shaping air flow or shaping air pressure of shaping air delivered to form a spray of the applicator, c) high voltage of an electrostatic coating agent charge, or d) drive air flow or drive air pressure for driving a compressed air turbine of a rotation atomizer forming the applicator.

* * * * *